United States Patent

[11] 3,594,889

[72] Inventor William S. Clark
So. Hamilton, Mass.
[21] Appl. No. 866,563
[22] Filed Oct. 15, 1969
[45] Patented July 27, 1971
[73] Assignee USM Corporation
Flemington, N.J.

[54] TERMINAL-INSERTING MACHINES HAVING IMPROVED INSIDE FORMER
5 Claims, 9 Drawing Figs.

[52] U.S. Cl. ........................................ 29/203B, 227/109
[51] Int. Cl. ........................................ H01r 43/04, B25c 5/02
[50] Field of Search ........................................ 29/203, 203 B, 203 DT, 203 D; 227/109

[56] References Cited
UNITED STATES PATENTS

| | | | |
|---|---|---|---|
| 2,896,213 | 7/1959 | Alderman et al. ............ | 29/203 |
| 3,078,466 | 2/1963 | Harrold et al. ................. | 227/109 X |

*Primary Examiner*—Thomas H. Eager
*Attorneys*—W. Bigelow Hall, Richard A. Wise and Carl E. Johnson

ABSTRACT: A wire-forming mechanism, for instance in a machine for forming and applying oppositely extending leads of components, comprises an inside former adapted in response to forming operation of an outside former, suitably to yield whereby leads of different diameters may be accommodated and precisely formed and advanced under control for terminal insertion. The invention has particular advantage in enabling a single inserting machine to attain reliable mounting in a printed circuit board of a pretaped series of components having differently sized bodies as well as differently sized leads.

Inventor
William S. Clark
By his Attorney
Carl E. Johnson.

PATENTED JUL 27 1971

3,594,889

TERMINAL-INSERTING MACHINES HAVING IMPROVED INSIDE FORMER

BACKGROUND OF THE INVENTION

This invention relates to devices for forming terminals, and more especially to means for forming the oppositely extending leads of electrical components to be mounted on circuit boards.

Printed circuits are formed with appropriate lead-receiving holes and provide interconnection between a variety and multitude of electronic components to be secured thereon. Heretofore component-mounting machines, for instance of the type disclosed in U.S. Pat. No. 2,896,213, issued July 28, 1959 upon an application filed in the names of L.D. Alderman et al., have employed instrumentalities for sequentially cutting, forming and inserting coaxial leads. To ensure proper soldering connections and good clinching of the extremities of the inserted leads, it is desirable that the tolerances at the lead-receiving holes be small. Moreover, since such machines are often automatically controlled and usually expected to perform large numbers of component insertions, their reliability for precision operation must be high.

Component-inserting machines of the type referred to generally employ an inside former for supporting each component by its coaxial leads adjacent to its body, a pair of outside reciprocable formers having aligned grooves for bending the respective leads into U-shaped arrangement over the inside former and then directing the leads to the board-receiving holes, and a reciprocable driver bar for thereupon displacing the inside former from its operating position and advancing the component body onto the board with the leads guided by the outside former grooves and extending through the holes. Sometimes means are provided for enabling the driver bar to yield in the direction of its operating stroke in order to accommodate different diameters of component bodies, and sometimes support means for the component to be formed is made adjustable to accommodate different lengths of component bodies as disclosed for instance in U.S. Pat. No. 3,078,466, issued Feb. 26, 1963 in the names of Harrold et al. It is generally found that lead thickness, hereinafter usually referred to as "-diameter" though it is appreciated leads are not always round in section, differs considerably for different types of components, usually being greater for larger component bodies. The rigid inside former means hitherto incorporated in a single machine, even if mechanically adjustable lengthwise of a component body, have been incapable (due to differences in lead diameter) of forming leads of different components with sufficient precision to insure their being guided by the outside former means endwise into the circuit holes. The present invention, by a simple yet effective modification to inside formers as heretofore known, enables a single-inserting machine to accurately and reliably install leads differing in diameter and thereby, for example, to install the different sizes of leads of presequenced components of many types.

SUMMARY OF THE INVENTION

In view of the foregoing it is a primary object of this invention to provide a component-inserting machine having improved means for forming into U-shaped arrangement the initially oppositely extending leads of components even when the diameters of the leads differ in cross-sectional size and/or shape. A further object of the invention is to provide a more versatile component-inserting machine capable of mounting in succession the leads of sequenced components of different types having leads of different thickness and/or cross-sectional shape.

To the ends just stated the invention contemplates provision in a machine of an inside former having laterally opposed portions engageable respectively with the inside of the leads to be formed into parallel depending legs, these opposed inside former portions being yieldable toward one another in response to pressure exerted by the cooperative forming action of the outside formers on the leads. As herein shown an inside former is made thus suitably yieldable merely by providing a central slot extending normal to and between the coaxial portions of the leads to be formed. In causing the leads to be bent over the laterally spaced and yieldable portions of the novel inside former the outside former exerts a wiping action inwardly on the outer sides of the leads, and the lateral portions of the inside former yield inwardly automatically to the extent needed properly to accommodate the diameters of the particular leads then being formed.

BRIEF DESCRIPTION OF THE DRAWINGS

The foregoing and other features of the invention, including novel details and combinations of parts, will now be more particularly described with reference to the accompanying drawings in which.

DESCRIPTION OF THE PREFERRED EMBODIMENT

Figure 9:
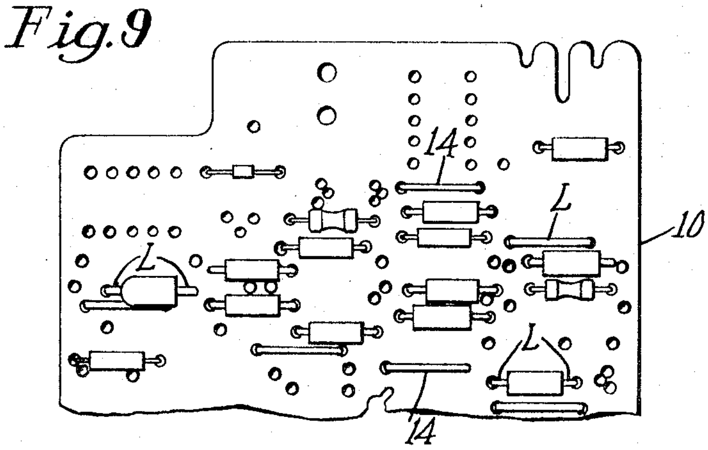
FIG. 9 illustrates some of the differently shaped and sized components as mounted in a circuit board by the illustrated machine.

For purposes of illustration only it may be assumed that the electronic components to be mounted in preformed lead-receiving holes of a support such as a printed circuit board 10 (FIG. 9), are fed by means of tape T (FIG. 1) from a source of supply to a machine head generally designated 12 (FIGS. 2, 4, 6, and 8). The components are of coaxial lead type but may have different electrical functions and be fed successively by the tape T or any other suitable means. Accordingly as shown in FIG. 1 their bodies may have different size and shape or, in the case of a jumper wire 14, have no body. Their leads L differ also in size and/or cross-sectional shape and commonly are only generally coaxial, often becoming somewhat bent or misaligned with their body axes prior to mounting. It is dealing with the different lead diameters of the successive components which has heretofore given rise to difficulty in having a single machine reliably mount the different components in succession.

Since construction and operation of the machine are basically as fully described in the Alderman et al. patent referred to above only so much of the head 12 will now be described as is essential to a complete understanding of the present invention.

The tape T carries the components in sequence down a raceway 16 to the lower portion of the head 12, a pair of peripherally grooved indexing wheels 18, 18 (FIG. 4) engaging successive pairs of leads L to advance them sidewise onto a pair of spaced shear blocks 20, 20. These blocks are secured to the bottom of a casing 22 in which the wheels 18 are journaled. Pivoted on a horizontal pin 24 secured in the casing is an inside former 26 having a general configuration as disclosed in the above-mentioned Alderman et al. patent except for an important distinction hereinafter to be described. The inside former 26 has a U-shaped lower portion for accommodating the component bodies as their leads initially rest on the shear blocks 20. Additionally the casing 22 houses a composite vertically reciprocable driver bar 28, a pair of outside formers 30, 30 reciprocable at either side of the bar, and lead cutters 32, 32, cooperative with the shear blocks 20, respectively, prior to lead bending.

The inside former 26 is initially disposed to support the leads L of each successive endmost component adjacent to its body by means of laterally spaced portions 34, 34 which, for reasons later emphasized, are yieldable toward one another. For thus fixedly positioning the inside former against pivotal movement during lead bending by the relatively descending outside formers 30 an upper end of the inside former abuts a flat 36 (FIG. 2) on the driver bar 28. As perhaps best seen in FIG. 3 the outside formers 30 are respectively provided with vertical guide grooves 38 the walls of which are engageable with outer sides of the adjacent leads L after they have been severed by descent of the cutters 32 onto the blocks 20. As the outside formers descend relatively to the inside former each groove wall wipes and bends the adjacent lead over the adjacent portion 34 and serves as a directing channel for steering the lower end of the bent lead precisely into and through a selected receiving hole of the board 10. When the leads of a component have their legs or outer portions bent into parallel relation, the driver bar 28 descends, its V-notched extremities 40, 40 (FIGS. 3, 6 and 8) bearing on the unbent or shoulder portions of the leads to force them endwise into the circuit board exactly as guided by the outside former grooves 38. In order to permit this inserting movement by the driver bar 28 the upper end of the inside former is then above the flat 36 of the bar and may pivot (counterclockwise as viewed in FIG. 2) to an inoperative position.

Figures 1, 2:
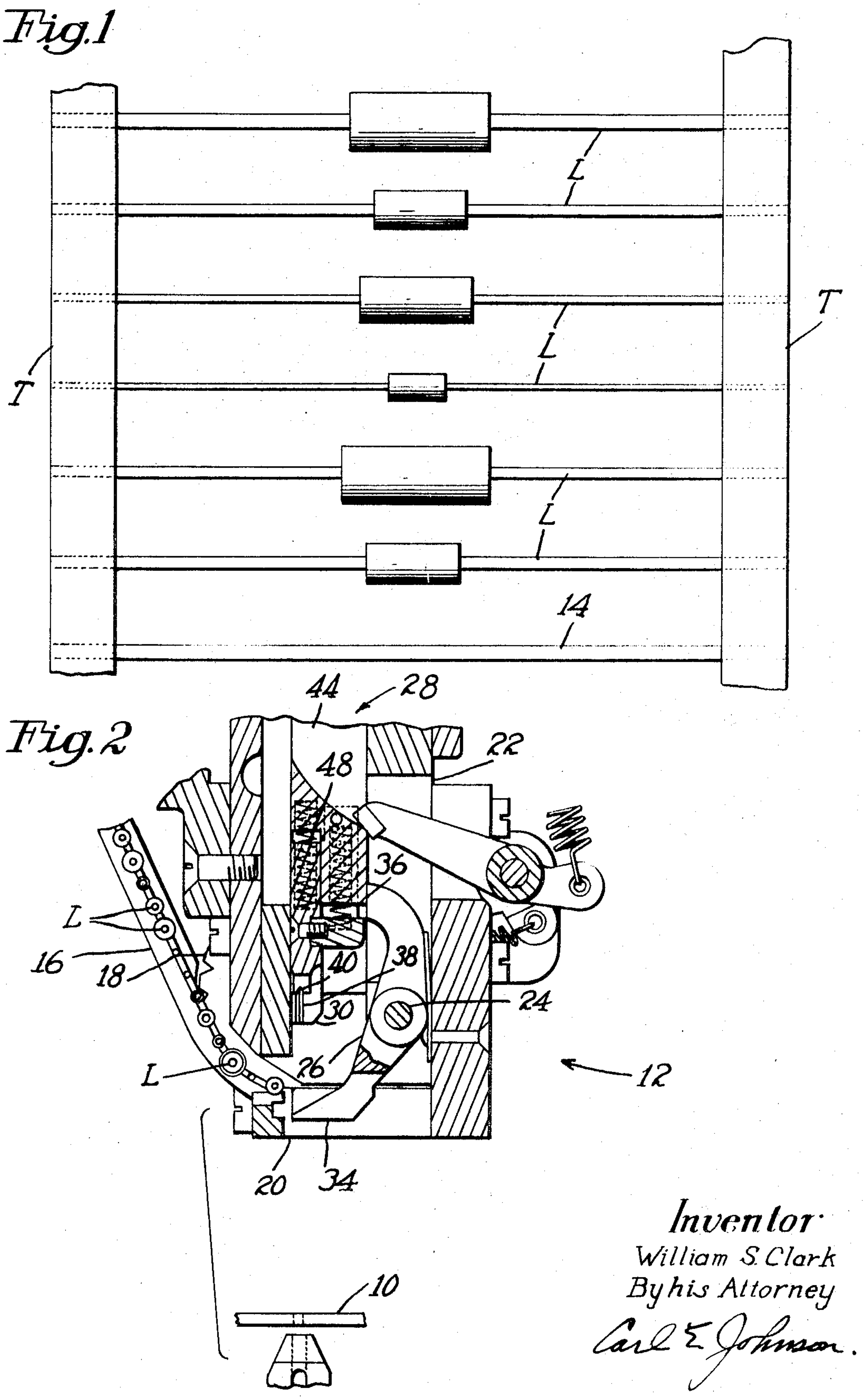
FIG. 1 is a view of an illustrative portion of a series of tape-mounted electronic components of different sizes and types.
FIG. 2 is a vertical section of a portion of a component-inserting machine, its lead-forming mechanism being in inoperative position above a circuit board and lead-clinching means.
Figures 3, 4:
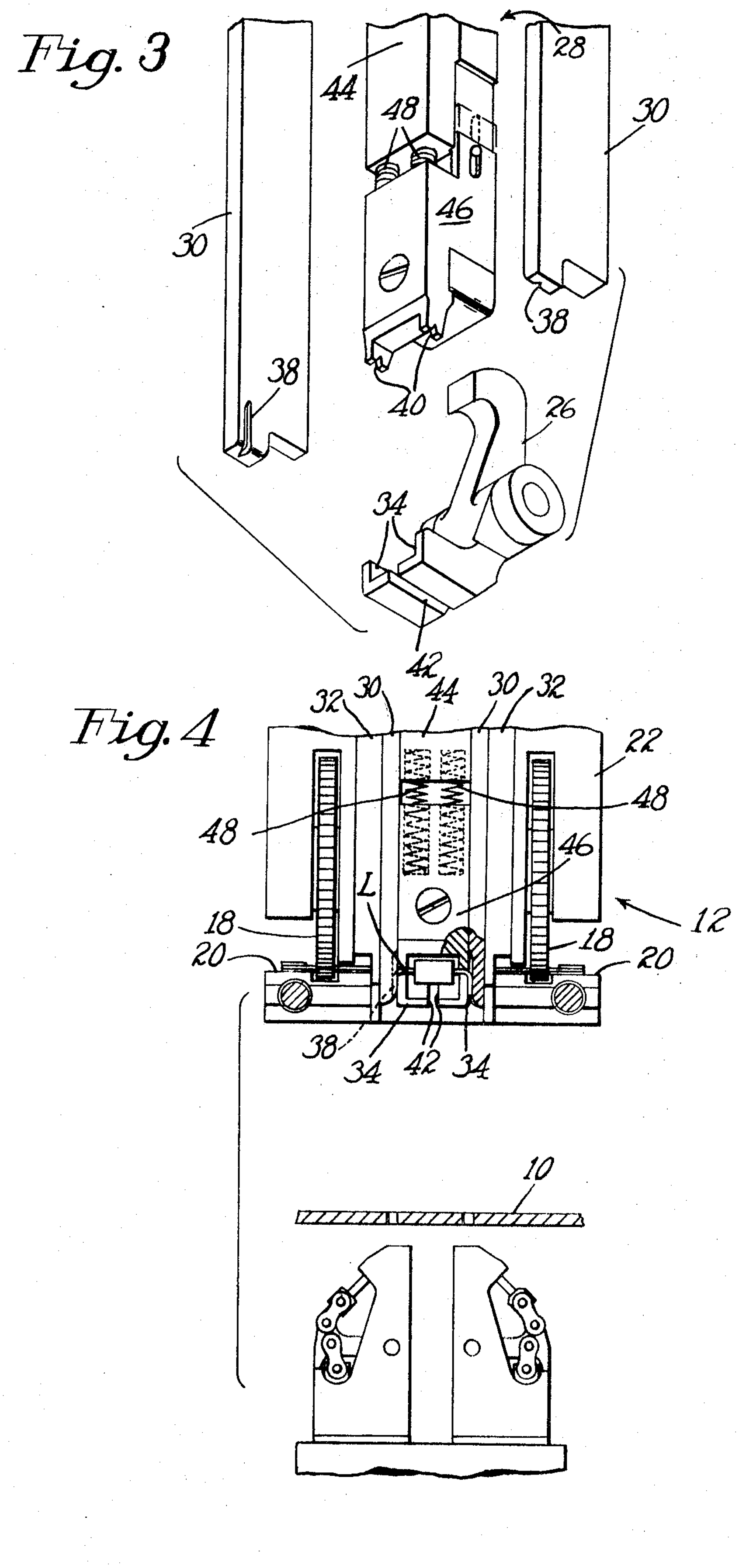
FIG. 3 is a fragmentary perspective view of our novel inside former and associated outside formers and driver bar.
FIG. 4 is a view in front elevation of the mechanism shown in FIGS. 2 and 3, the parts being in lead-forming position.
Figures 5, 6, 7, 8:
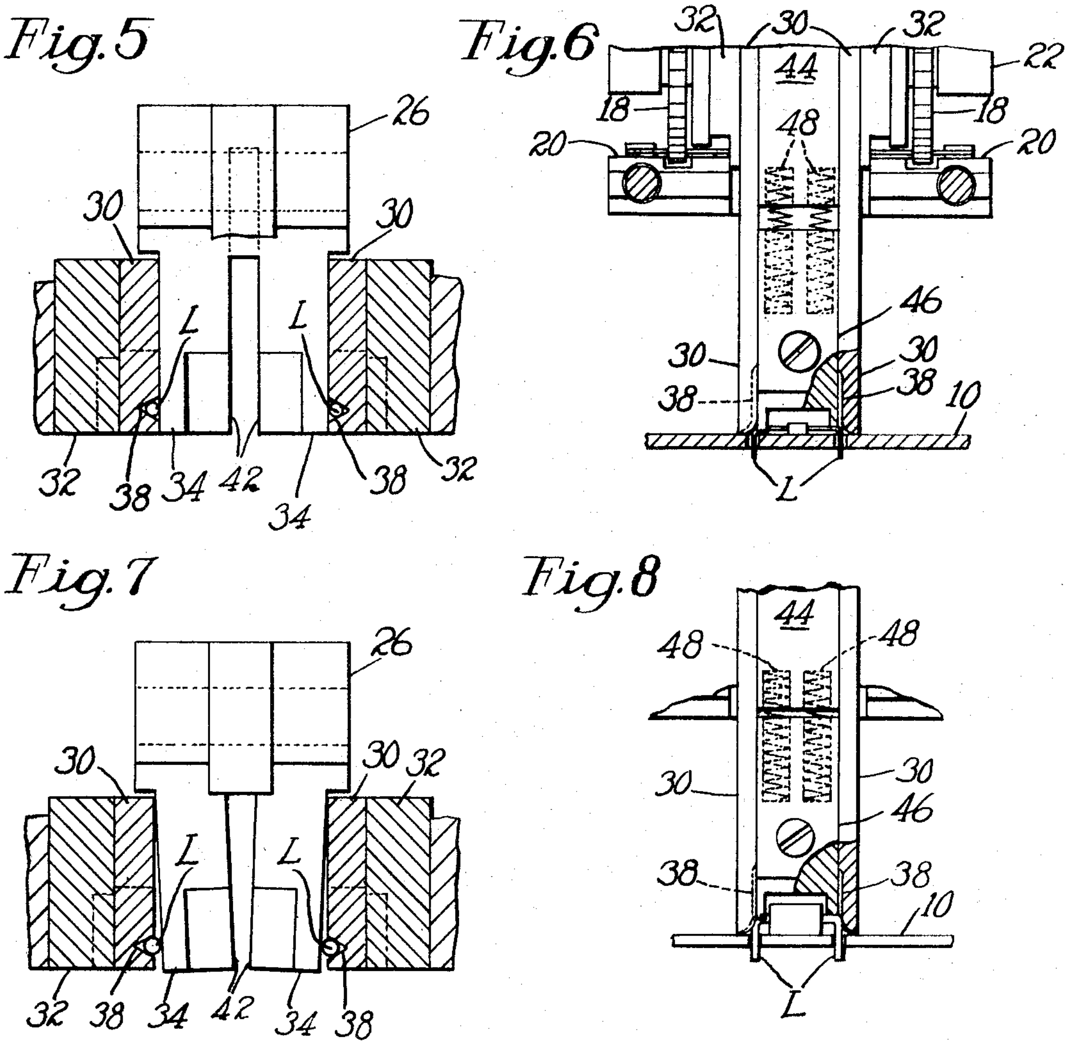
FIG. 5 is a plan view, partly in section, showing the inside former acting on component leads to be inserted.
FIG. 6 is a front view of the mechanism shown in FIGS. 4 and 5 but at a sequence stage in the inserting cycle.
FIG. 7 is a plan view corresponding to FIG. 5 showing, by way of contrast, the forming action on the larger leads of a component.
FIG. 8 is a front view corresponding to FIG. 6 and illustrating the mounting of the component leads shown in FIG. 7.

It is to be noted that the rigid unyielding character of the inside former as hitherto disclosed, for instance in the cited Alderman patent, is quite satisfactory for cooperating with a given outside former in bending and guiding leads of a specified diameter but cannot additionally handle larger diameters because of jamming, and in the case of leads having smaller diameters they fail to be retained in the outside former grooves and hence cannot be properly inserted by the driver bar 28. In contrast thereto, a central slot 42 (FIGS. 3–5 and 7) extending in the lower portion of our novel inside former 26 normal to the axis of a component thereon allows yieldability of the portions 34, 34 toward each other in response to the inward-forming pressure transmitted through the leads by the grooved walls 38 of the adjacent outside formers. FIGS. 5 and 7 show the capability range of the inside former 26 which greatly increases the versatility of the machine. In FIG. 5 the smaller diameter leads are retained wholly in the outside former grooves by the inside former portions 34, and in FIG. 7 the larger diameter leads are retained under control of the inside former portions 34 which have been displaced inwardly toward one another due to pressure exerted through the leads by the adjacent outside formers. In both cases the axes of the bent leads is precisely located in relation to the outside former grooves 38 and hence can be predeterminately directed endwise by the driver bar 28 to insure reception in the intended printed circuit holes as indicated in FIGS. 6 and 8.

The driver bar 28 is desirably composite to enable it to self-adjust to the different diameters or thicknesses of the component bodies. As hitherto disclosed in the mentioned Alderman et al. patent a main portion 44 (FIGS. 2—4) of the driver bar reciprocates with a fixed length of stroke. A lower portion 46 of the driver bar having the V-notches 40 has pin and slot connection with the main portion 44, compression springs 48 nested in the latter urging the portions 44, 46 apart to the limited extent permitted by the pin and slot connection. Comparing FIGS. 5 and 6 with FIGS. 7 and 8 it will be observed that not only has the inside former yielded laterally inward as necessary suitably to form the larger leads in the FIGS. 7 and 8 but the latter views show how the driver portion 46 has thereafter yielded upwardly toward the main driver portion 44 to the proper degree upon contact of the larger component body with the board 10.

Merely by way of providing an illustration, an inside former adapted to form leads having diameters in the range of from 0.019—0.032 inches might have each portion 34 yieldable inwardly up to about 0.01 inches.

Having thus described my invention what I claim as new and desire to secure by Letters Patent of the United States is:

1. In a machine for forming the leads of coaxial lead-type components, which leads may respectively differ in diameter over a dimensional range, a reciprocable outside former having a guide groove the wall of which is engageable with an outer side of each lead to be formed, and a bodily movable inside former operative in one position to engage the inner side of said lead and cooperative with the outside former to bend and direct the lead away from the axis of the component, said inside former having a lead engaging portion yieldable laterally in response to inward pressure transmitted through the lead by the grooved wall of the outside former acting on said lead.

2. A machine as set forth in claim 1 wherein said inside former has a pair of laterally opposed, inwardly yieldable portions whereby the diameters of both leads of a coaxial lead-type component are similarly accommodated during its lead formation.

3. A machine as set forth in claim 2 wherein said yieldability of inside former portions is permitted by a slot extending centrally therebetween.

4. In a machine for mounting on a circuit board the presequenced components of a series having different sizes and/or spaces of component bodies and coaxial leads, said machine being of the type having a reciprocable inserter and outside formers operative at opposite sides of the inserter to bend and guide the leads of each component prior to their insertion at a selected locality of the board, the improvement which consists in providing a pivotal inside former for supporting each component by its oppositely extending leads during their bending by the outside formers, the inside former having spaced lead-engaging portions laterally yieldable inwardly to accommodate the leads bent thereover by the outside formers.

5. For use in a machine for bending and inserting the leads of different coaxial lead-type components, an inside former having spaced portions projecting in generally parallel relation and movable between a pair of reciprocable outside formers and to and from an operating position in which said portions support a component the leads of which are to be formed for insertion, said portions being adapted to be yieldingly displaced toward one another on engaging the inner sides of the leads as they are wiped thereover by the outside formers.